(12) United States Patent
Senda et al.

(10) Patent No.: US 7,630,239 B2
(45) Date of Patent: Dec. 8, 2009

(54) SEMICONDUCTOR DEVICE

(75) Inventors: Minoru Senda, Tokyo (JP); Jun Setogawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/898,376

(22) Filed: Sep. 11, 2007

(65) Prior Publication Data
US 2008/0175066 A1 Jul. 24, 2008

(30) Foreign Application Priority Data
Sep. 21, 2006 (JP) ............................. 2006-256143

(51) Int. Cl.
*G11C 11/34* (2006.01)
(52) U.S. Cl. ............................. 365/185.03; 365/185.24
(58) Field of Classification Search ............ 365/185.03, 365/185.24
See application file for complete search history.

(56) References Cited
U.S. PATENT DOCUMENTS

| | | | |
|---|---|---|---|
| 6,058,042 A | 5/2000 | Nobukata | |
| 6,507,518 B2 | 1/2003 | Hosono et al. | |
| 6,996,014 B2 | 2/2006 | Lee et al. | |
| 2003/0169622 A1* | 9/2003 | Ooishi et al. ........... | 365/185.21 |
| 2004/0095830 A1* | 5/2004 | Tanaka .................... | 365/222 |

FOREIGN PATENT DOCUMENTS

| | | |
|---|---|---|
| JP | 11-242894 A | 9/1999 |
| JP | 2000-163977 A | 6/2000 |
| JP | 2002-140899 A | 5/2002 |
| JP | 2004-192780 A | 7/2004 |

* cited by examiner

*Primary Examiner*—Michael T Tran
(74) *Attorney, Agent, or Firm*—Miles & Stockbridge P.C.

(57) ABSTRACT

The present invention provides a semiconductor device which comprises a plurality of memory cells which stores data therein based on threshold voltages thereof, a plurality of bit lines on which read signals based on the stored data of the memory cells appear respectively, a plurality of sense amplifiers which are respectively disposed corresponding to the bit lines and which respectively detect the read signals having appeared on the bit lines and output first and second signals respectively having logical levels different from one another from first and second nodes, based on the detected read signals, and a determination unit which determines, based on the first and second signals received from the first and second nodes of the sense amplifiers, whether the threshold voltages of the memory cells are normal.

4 Claims, 8 Drawing Sheets

US 7,630,239 B2

SEMICONDUCTOR DEVICE

CROSS-REFERENCE TO RELATED APPLICATIONS

The disclosure of Japanese patent application No. 2006-256143 filed on Sep. 21, 2006 including the specification, drawings and abstract is incorporated herein by reference in its entirety.

BACKGROUND OF THE INVENTION

The present invention relates to a semiconductor device, and particularly to a semiconductor device which performs a verify operation on stored data.

A semiconductor device, for example, a flash memory capable of storing information in a floating gate (FG) by injecting electrons into the floating gate or extracting the same therefrom has been developed. The flash memory includes memory cells each having a floating gate, a control gate (CG), a source, a drain and a well (substrate). In each memory cell, its threshold voltage rises when electrons are injected into the floating gate, whereas it is reduced when the electrons are extracted from the floating gate. In general, a distribution of the lowest threshold voltage is called "erase state of each memory cell". A distribution of a threshold voltage higher than at the erase state is called "write state of each memory cell". When, for example, a memory cell stores data of two bits therein, a distribution of the lowest threshold voltage corresponds to a logical level "11". This state is called "erase state". By effecting a write operation on each memory cell and making its threshold voltage higher than at the erase state, a threshold voltage corresponding to each of logical levels "10", "01" and "00" is obtained. This state is called "write state".

While the flash memory is normally provided with a plurality of memory cells, the threshold voltages of the memory cells vary due to variations in production and the like. Therefore, the flash memory performs a verify operation for supplying a read voltage to a control gate of each memory cell after data writing and data erasure and determining, based on whether the memory cell is brought to an on state or an off state, whether a threshold voltage distribution of the memory cell falls within a desired range (refer to, for example, patent documents 1 (Japanese Unexamined Patent Publication No. 2002-140899), 2 (Japanese Unexamined Patent Publication No. 2004-192780), 3 (Japanese Unexamined Patent Publication No. 2000-163977) and 4 (Japanese Unexamined Patent Publication No. Hei 11 (1999)-242894)).

SUMMARY OF THE INVENTION

Meanwhile, the flash memory generally includes bit lines on each of which a small difference in voltage, i.e., a read signal appears according to the on and off states of each memory cell. Further, the flash memory has a sense amplifier which detects the read signal having appeared on each bit line and outputs complementary signals, i.e., two signals having logical levels different from each other from two nodes on the basis of the detected read signal.

In general, the threshold voltages of a plurality of memory cells are simultaneously determined upon verify in the flash memory. When a lower skirt of a threshold voltage distribution of each memory cell is determined, a read voltage corresponding to a minimum value in a threshold-voltage desired range is supplied to all verify-targeted memory cells. If all the verify-targeted memory cells are in an off state, then the threshold voltages thereof are judged to be normal.

On the other hand, a determination as to an upper skirt of the threshold voltage distribution is also required to attain narrow-banding of the threshold voltage distribution. When the upper skirt of the threshold voltage distribution is determined, a read voltage corresponding to a maximum value in a threshold-voltage desired range is supplied to all verify-targeted memory cells. If all the verify-targeted memory cells are in an on state, then the threshold voltages thereof are judged to be normal. That is, the logical levels of complementary signals at the time that the threshold voltages are normal upon the lower and upper skirt determinations of the threshold voltage distributions are reversed each other.

Here, the flash memory preferably takes such a configuration that both the upper skirt determination of the threshold voltage distribution and the lower skirt determination thereof are carried out without complicating the configuration of a determination circuit for determining based on the complementary signals whether the threshold voltage of each memory cell is normal.

In the semiconductor device described in each of the patent documents 1 through 4, however, the above determination circuit is coupled to either one of the two nodes of the sense amplifier from which the complementary signals are outputted. Thus, the semiconductor device described in each of the patent documents 1 through 4 needs to control the sense amplifier and its peripheral circuits thereby to invert the logical levels of the complementary signals upon execution of the lower skirt determination of the threshold voltage distribution or its upper skirt determination in order to carry out both the upper skirt determination of the threshold voltage distribution and its lower skirt determination without complicating the configuration of the determination circuit. Therefore, the semiconductor device is accompanied by the problems that it takes long time to determine whether the threshold voltage of each memory cell is normal, and a data write time and a data erase time are prolonged.

Therefore, an object of the present invention is to provide a semiconductor device capable of preventing complication of a circuit configuration thereof and determining in a short period of time whether a threshold voltage of each memory is normal.

In order to solve the above problems, a semiconductor device according to a given aspect of the present invention comprises a plurality of memory cells which store data therein based on threshold voltages thereof, a plurality of bit lines on which read signals based on the stored data of the memory cells appears respectively, a plurality of sense amplifiers which are respectively disposed corresponding to the bit lines and which respectively detect the read signals having appeared on the bit lines and output first and second signals respectively having logical levels different from one another from first and second nodes on the basis of the detected read signals, and a determination unit which determines, based on the first and second signals respectively accepted from the first and second nodes of the sense amplifiers, whether the threshold voltages of the memory cells are normal.

According to the present invention, it is possible to prevent complication of a circuit configuration and determine in a short period of time whether a threshold voltage of each memory cell is normal.

DETAILED DESCRIPTION OF THE PREFERRED EMBODIMENTS

Preferred embodiments of the present invention will hereinafter be explained using the accompanying drawings. Incidentally, the same symbols are attached to the same or equivalent members or portions, of which the descriptions are omitted.

First Preferred Embodiment

[Configuration and Basic Operation]

Figure 1:
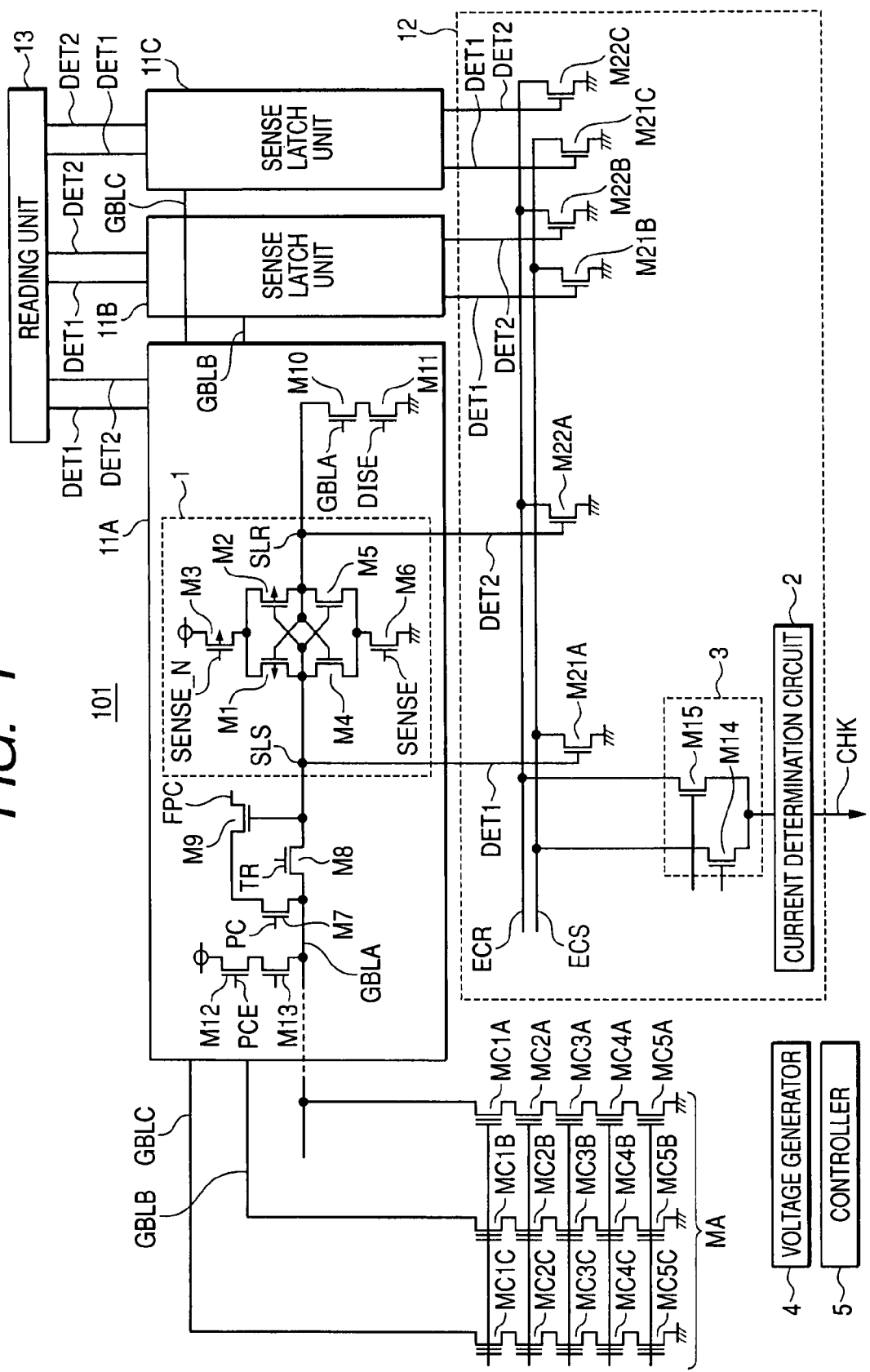
FIG. 1 is a diagram showing a configuration of a semiconductor device according to a first embodiment of the present invention.

FIG. 1 is a diagram showing a configuration of a semiconductor device according to a first embodiment of the present invention.

Referring to FIG. 1, the semiconductor device 101 includes sense latch units 11A through 11C, a determination unit 12, a reading unit 13, a memory cell array MA, a voltage generator 4, a controller 5, global bit lines GBLA, GBLB and GBLC. Each of the sense latch units 11A through 11C includes a sense amplifier 1, N channel MOS (Metal Oxide Semiconductor) transistors M7 through M13. The sense amplifier 1 includes P channel MOS transistors M1 through M3, and N channel MOS transistors M4 through M6. The determination unit 12 includes N channel MOS transistors (first transistors) M21A through M21C, N channel MOS transistors (second transistors) M22A through M22C, a current determination circuit 2 and a switching circuit 3. The switching circuit 3 includes N channel MOS transistors M14 and M15. The memory cell array MA includes a plurality of memory cells that stores data therein based on threshold voltages, i.e., memory cells MC1A through MC5A, memory cells MC1B and MC5B, and memory cells MC1C through MC5C.

The memory cells in the memory cell array MA may hereinafter be generically called "memory cells MC". The global bit lines GBLA, GBLB and GBLC may generically be called "global bit lines GBL".

A read signal based on data stored in its corresponding memory cell MC appears on each of the global bit lines GBLA, GBLB and GBLC.

Each sense amplifier 1 is a latch type sense amplifier and disposed corresponding to the global bit line GBL. And the sense amplifier 1 detects the read signal that appears on the corresponding global bit line GBL and outputs complementary signals, i.e., a detection signal DET1 and a detection signal DET2 having logical levels different from each other from an SLS node and an SLR node on the basis of the detected read signal.

The determination unit 12 determines based on the detection signals DET1 and detections signals DET2 respectively received from the SLS nodes and SLR nodes of the sense amplifiers 1 of the sense latch units 11A through 11C, whether the semiconductor device 101 is defective, that is, the threshold voltages of the memory cells MC1A through MC5A, MC1B through MC5B and MC1C through MC5C are normal.

The N channel MOS transistors M21A through M21C are respectively disposed corresponding to the sense latch units 11A through 11C and perform switching between on and off states, based on the detection signals DET1 received from the SLS nodes of the sense amplifiers 1 at their corresponding sense latch units.

The N channel MOS transistors M22A through M22C are respectively disposed corresponding to the sense latch units 11A through 11C and perform switching between on and off states, based on the detection signals DET2 received from the SLR nodes of the sense amplifiers 1 at their corresponding sense latch units.

The switching circuit 3 switches connections of the current determination circuit 2 and the N channel MOS transistors M21A through M21C or connections of the current determination circuit 2 and the N channel MOS transistors M22A through M22C. Described more specifically, when the N channel MOS transistor 14 is in an on state, the current determination circuit 2 and the N channel MOS transistors M21A through M21C are coupled. When the N channel MOS transistor 15 is in an on state, the current determination circuit 2 and the N channel MOS transistors M22A through M22C are coupled.

The current determination circuit 2 detects output currents of the N channel MOS transistors M21A through M21C, which are received via a current line ECS or output currents of the N channel MOS transistors M22A through M22C, which are received via a current line ECR. Then, the current determination circuit 2 compares the detected output currents and a reference current with one another and outputs the result of comparison, i.e., a determination or decision signal CHK indicative of whether the threshold voltage of each verify-targeted memory cell is good or normal. Incidentally, the semiconductor device 101 may take such a configuration that the switching circuit 3 is not provided, and the current determination circuit 2 simultaneously detect the output currents of the N channel MOS transistors M21A through M21C accepted via the current line ECS and the output currents of the N channel MOS transistors M22A through M22C accepted via the current line ECR.

The controller 5 controls the respective circuits in the semiconductor device 101. The voltage generator 4 supplies voltages to nodes and control lines or the like in the semiconductor device 101, based on the control of the controller 5.

The reading unit 13 is coupled to the SLS nodes and SLR nodes of the sense latch units 11A through 11C and outputs the stored data of the memory cells to the outside as read data, based on the detection signals DET1 and detection signals DET2 received from the SLS nodes and SLR nodes of the sense amplifiers 1.

[Operation]

The verify operation of the semiconductor device according to the first embodiment of the present invention will next be described.

Figure 2:
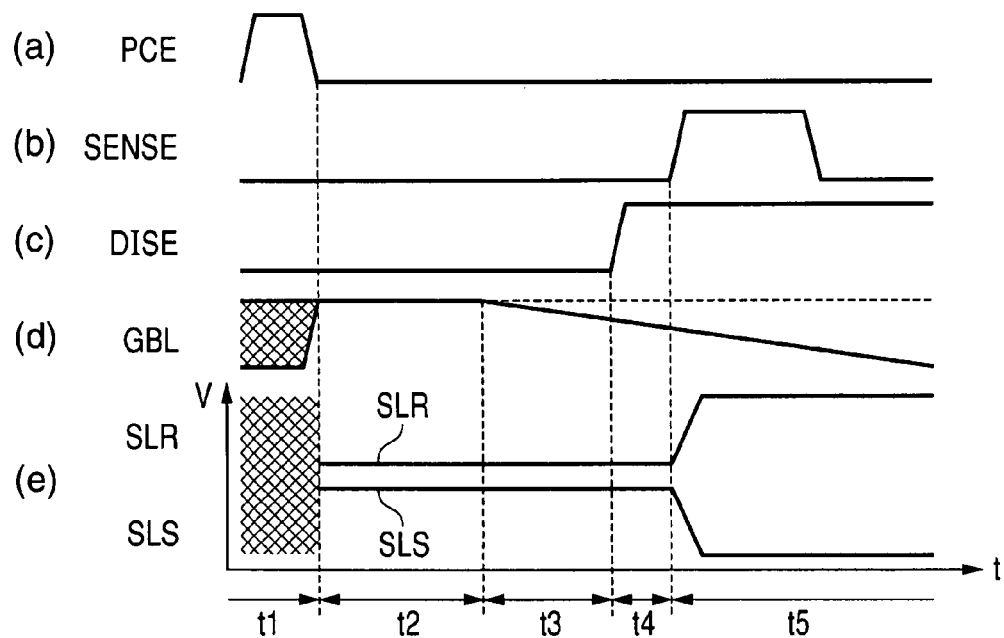
FIGS. 2(a) through 2(e) are respectively waveform diagrams showing a verify operation of the semiconductor device according to the first embodiment of the present invention.

FIGS. 2(*a*) through 2(*e*) are respectively waveform diagrams showing the verify operation of the semiconductor device according to the first embodiment of the present invention. FIGS. 2(*a*) through 2(*e*) are waveform diagrams at the time that each verify-targeted memory cell is in an on state.

Figure 3:
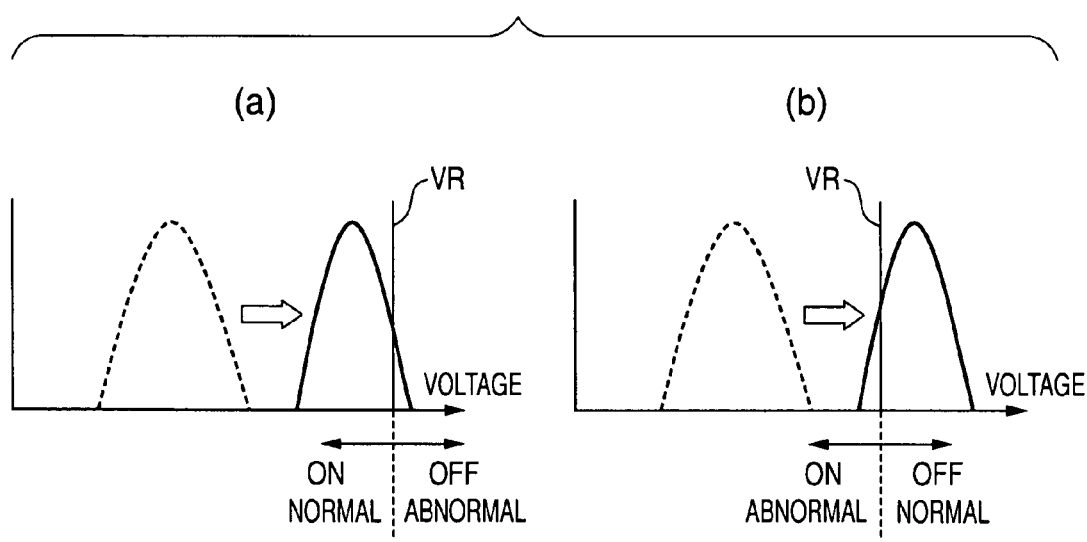
FIG. 3(a) is a diagram illustrating an upper skirt determination of a threshold voltage distribution of each memory cell.
FIG. 3(b) is a diagram showing a lower skirt determination of a threshold voltage distribution of each memory cell.

FIG. 3(*a*) is a diagram showing an upper skirt determination of a threshold voltage distribution of each memory cell. FIG. 3(*b*) is a diagram showing a lower skirt determination of a threshold voltage distribution of each memory cell. FIG. 3 shows the manner in which threshold voltage distributions corresponding to two logical levels are shown and threshold voltage distributions indicated by solid lines are determined.

A description will be made below, of the case in which the verify-targeted memory cells are the memory cells MC2A through MC2C.

Referring to FIG. 1, each of the N channel MOS transistors M13 is disposed so as to adjust the amount of electric charge charged on its corresponding global bit line GBL. The gate of the N channel MOS transistor M13 is supplied with a predetermined voltage corresponding to a predetermined amount of electric charge and is in an on state. Each of control signals PC, TR and FPC is a low level, and the N channel MOS transistors M7 through M9 are respectively in an off state.

Referring to FIG. 2, the controller 5 outputs an H-level control signal PCE to the gate of the corresponding N channel MOS transistor M12 (t1). In doing so, a predetermined amount of charge is charged onto the corresponding global bit line GBL.

An unillustrated precharge circuit charges an electric charge onto each of the SLS and SLR nodes in such a manner that the potential of the SLR node becomes higher than that of the SLS node (t2).

Next, the controller 5 supplies a read voltage (verify voltage) VR to each of the verify-targeted memory cells MC2A through MC2C. Referring to FIG. 3(*a*), the controller 5 supplies a read voltage VR corresponding to the maximum value in a threshold-voltage desired range to each memory cell where the upper skirt of the threshold voltage distribution of each memory cell is determined.

When the upper skirt of the threshold voltage distribution of each memory cell is determined and the threshold voltage thereof is normal, the memory cell is brought to an on state. In this case, the electric charge charged onto the corresponding global bit line GBL is discharged via the memory cell held in the on state, so that the potential of the global bit line GBL is lowered. In doing so, the N channel MOS transistor M10 whose gate is coupled to its corresponding global bit line GBL, is brought to an off state. Therefore, the potential of the SLR node is held and remains unchanged. The potential of the SLS node is also held and remains unchanged (t3).

Next, the controller 5 outputs an H-level control signal DISE to the gate of the N channel MOS transistor M11 to bring the N channel MOS transistor M11 to an on state (t4).

Next, the controller 5 outputs a control signal SENSE_N of an L level to the gate of the P channel MOS transistor M3 and outputs a control signal SENSE of an H level to the gate of the N channel MOS transistor M6. Incidentally, the control signal SENSE_N is an inverted signal of the control signal SENSE. In doing so, the sense amplifier 1 is activated to amplify the level of the SLR node to a source voltage and amplify the level of the SLS node to a ground voltage. Further, the sense amplifier 1 retains the level of the SLR node and the level of the SLS node. That is, the sense amplifier 1 outputs an H-level detection signal DET2 and an L-level detection signal DET1 (t5).

Figure 4:
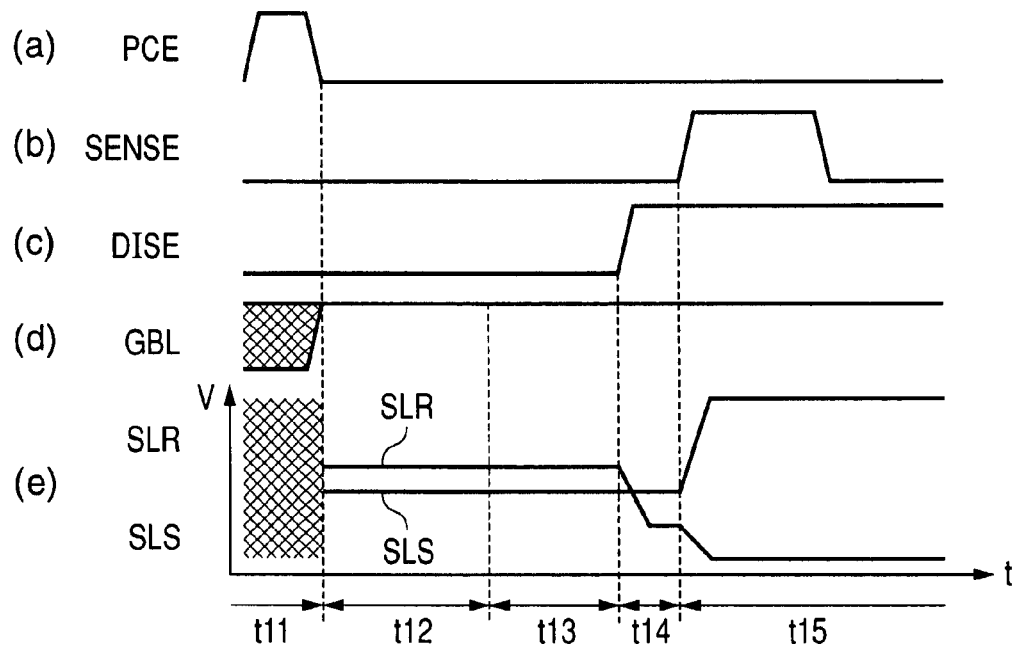
FIG. 4(a) through 4(e) are respectively waveform diagrams showing a verify operation of the semiconductor device according to the first embodiment of the present invention.

FIGS. 4(*a*) through 4(*e*) are respectively waveform diagrams showing a verify operation of the semiconductor device according to the first embodiment of the present invention. FIGS. 4(*a*) through 4(*e*) are waveform diagrams at the time that each verify-targeted memory cell is in an off state.

Since time intervals t11 and t12 are similar in operation to the time intervals t1 and t2 shown in FIG. 2, their detailed descriptions are omitted.

The controller 5 supplies a read voltage (verify voltage) to the gates of the verify-targeted memory cells MC2A through MC2C. Referring to FIG. 3(*b*), the controller 5 supplies a read voltage VR corresponding to the minimum value in a threshold-voltage desired range to the gate of each of the memory cells MC2A through MC2C where the lower skirt of the threshold voltage distribution of each memory cell is determined.

When the lower skirt of the threshold voltage distribution of each memory cell is determined and the threshold voltage thereof is normal, each memory cell is brought to an off state. In this case, the electric charge charged onto the corresponding global bit line GBL is not discharged, so that the potential of the global bit line GBL remains unchanged. In doing so, the N channel MOS transistor M10 whose gate is coupled to its corresponding global bit line GBL, is brought to an on state. Since the control signal DISE is low in level and the N channel MOS transistor M11 is in an off state here, the potential of the SLR node is held and remains unchanged. The potential of the SLS node is held and remains unchanged (t13).

Next, the controller 5 outputs an H-level control signal DISE to the gate of the N channel MOS transistor M11. In doing so, the electric charge charged to the SLR node is discharged via the N channel MOS transistors M10 and M11, so that the potential of the SLR node is lowered and becomes lower than the potential of the SLS node (t14).

Next, the controller 5 outputs a control signal SENSE_N of an L level to the gate of the P channel MOS transistor M3 and outputs a control signal SENSE of an H level to the gate of the N channel MOS transistor M6. In doing so, the sense amplifier 1 is activated to amplify the level of the SLR node to the ground voltage and amplify the level of the SLS node to the source voltage. Further, the sense amplifier 1 retains the level of the SLR node and the level of the SLS node. That is, the sense amplifier 1 outputs an L-level detection signal DET2 and an H-level detection signal DET1 (t15).

Figure 5:
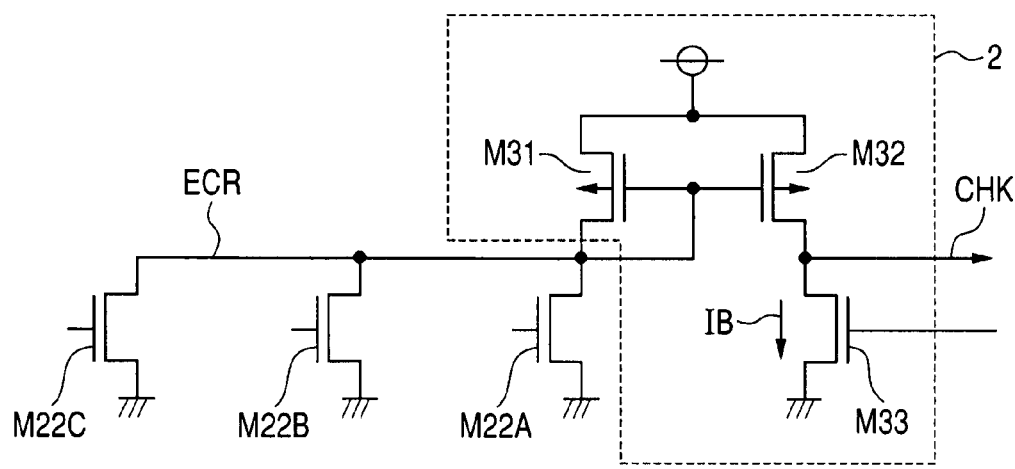
FIG. 5 is a diagram illustrating configurations of a current determination circuit and its peripheral circuits in the semiconductor device according to the first embodiment of the present invention.

FIG. 5 is a diagram showing configurations of the current determination circuit and its peripheral circuits in the semiconductor device according to the first embodiment of the present invention. A configuration wherein that the N channel MOS transistors M22A through M22C and the current determination circuit 2 are directly coupled to one another is shown in FIG. 5 in order to provide an easy explanation.

Since a relationship between the current line ECS and the N channel MOS transistors M21A through M21C, and the current determination circuit 2 is similar to that between the current line ECR and the N channel MOS transistors M22A through M22C, and the current determination circuit 2, its detailed descriptions are omitted.

Referring to FIG. 5, the current determination circuit 2 includes P channel MOS transistors M31 and M32 and an N channel MOS transistor M33.

The gate and drain of the P channel MOS transistor M31, the gate of the P channel MOS transistor M32, and the drains of the N channel MOS transistors M22A through M22C are coupled to one another.

The gate of the N channel MOS transistor M33 is supplied with a voltage of an H level and held in an on state.

When the sum of output currents of the N channel MOS transistors M22A through M22C is smaller than a reference current IB, the P channel MOS transistor M32 is brought to an off state, so that a determination or decision signal CHK becomes an L level. On the other hand, when the sum of the output currents of the N channel MOS transistors M22A through M22C is larger than the reference current IB, the P channel MOS transistor M32 is brought to an on state, so that the determination signal CHK becomes an H level.

Assume that, for example, the logical level of the determination signal CHK at the time that the threshold voltage of each memory cell is of an L level. Thus, if one of the SLR and SLS nodes through which an L-level signal is outputted from the sense amplifier 1 where the threshold voltage of each memory cell is normal, is selected and coupled to the current determination circuit 2, then both lower and upper skirt determinations of a threshold voltage distribution of each memory cell can be performed without changing the configuration of the current determination circuit 2.

As described above here, the sense amplifier 1 outputs an L-level detection signal DET1 and an H-level detection signal DET2 when the upper skirt determination of the threshold voltage distribution of each memory cell is done and the threshold voltage thereof is normal. When the lower skirt determination of the threshold voltage distribution of each memory cell is performed and the threshold voltage thereof is normal, the sense amplifier 1 outputs an H-level detection signal DET1 and an L-level detection signal DET2.

Therefore, when the upper skirt of the threshold voltage distribution of each memory cell is determined, the controller 5 controls the switching circuit 3 to couple the SLS node, i.e., the control line ECS corresponding to the detection signal DET1 to the current determination circuit 2. When the lower skirt of the threshold voltage distribution of each memory cell is judged, the controller 5 controls the switching circuit 3 to couple the SLR node, i.e., the control line ECR corresponding to the detection signal DET2 to the current determination circuit 2.

In this case, the determination unit 12 determines based on each of the detection signals DET1 respectively received from the sense amplifiers 1 of the sense latch units 11A through 11C, whether each of the threshold voltages of the verify-targeted memory cells is less than the maximum value in a predetermined range. The determination unit 12 determines based on each of the detection signals DET2 respectively received from the sense amplifiers 1 of the sense latch units 11A through 11C, whether each of the threshold voltages of the verify-targeted memory cells is greater than or equal to the minimum value in a predetermined range.

When the reference current IB corresponding to the output current of the N channel MOS transistor M33 is set to a value smaller than the output current of one of the N channel MOS transistors M22A through M22C, the current determination circuit 2 can determine whether the threshold voltages of all verify-targeted memory cells are normal, or the number of memory cells abnormal in threshold voltage exits one or more.

When the reference current IB is set to a value larger than the output current of one of the N channel MOS transistors M22A through M22C and smaller than the output currents of the two N channel MOS transistors, the current determination circuit 2 can determine that the number of memory cells abnormal in threshold voltage is not greater than one out of the verify-targeted memory cells, or the number of memory cells abnormal in threshold voltage exists two or more.

Meanwhile, the semiconductor device described in each of the patent documents 1 through 4 is accompanied by the problems that when the lower or upper skirt of each threshold voltage distribution is determined, it is necessary that the sense amplifier and its peripheral circuits are controlled to invert the logical levels of the complementary signals, and data write and erase times become long.

In the semiconductor device according to the first embodiment of the present invention, however, the determination unit 12 determines based on the detection signals DET1 and DET2 corresponding to the complementary signals respectively accepted from the SLS and SLR nodes of the sense amplifier 1 lying in each of the sense latch units 11A through 11C, whether each of the threshold voltages of the memory cells MC1A through MC5A, memory cells MC1B through MC5B and MC1C through MC5C is normal. Owing to such a configuration, both the lower skirt determination of the threshold voltage distribution of each memory cell and its upper skirt determination thereof can be performed without complicating the configuration of the current determination circuit 2 and inverting the logical levels of the complementary signals by controlling the sense amplifier and its peripheral circuits. Thus, the semiconductor device according to the first embodiment of the present invention can prevent complication of its circuit configuration and determine in a short period time whether the threshold voltage of each memory cell is normal.

Incidentally, although the semiconductor device 101 according to the first embodiment of the present invention comprises the three sense latch units and the respective circuits corresponding to these for the purpose of making an easy explanation, the present invention is not limited to it. The semiconductor device may comprise a few thousands of sense latch units like, for example, flash memories, and respective circuits corresponding to these.

Second Preferred Embodiment

The present embodiment relates to a semiconductor device wherein the configuration of a determination unit is changed as compared with the semiconductor device according to the first embodiment.

Figure 6:
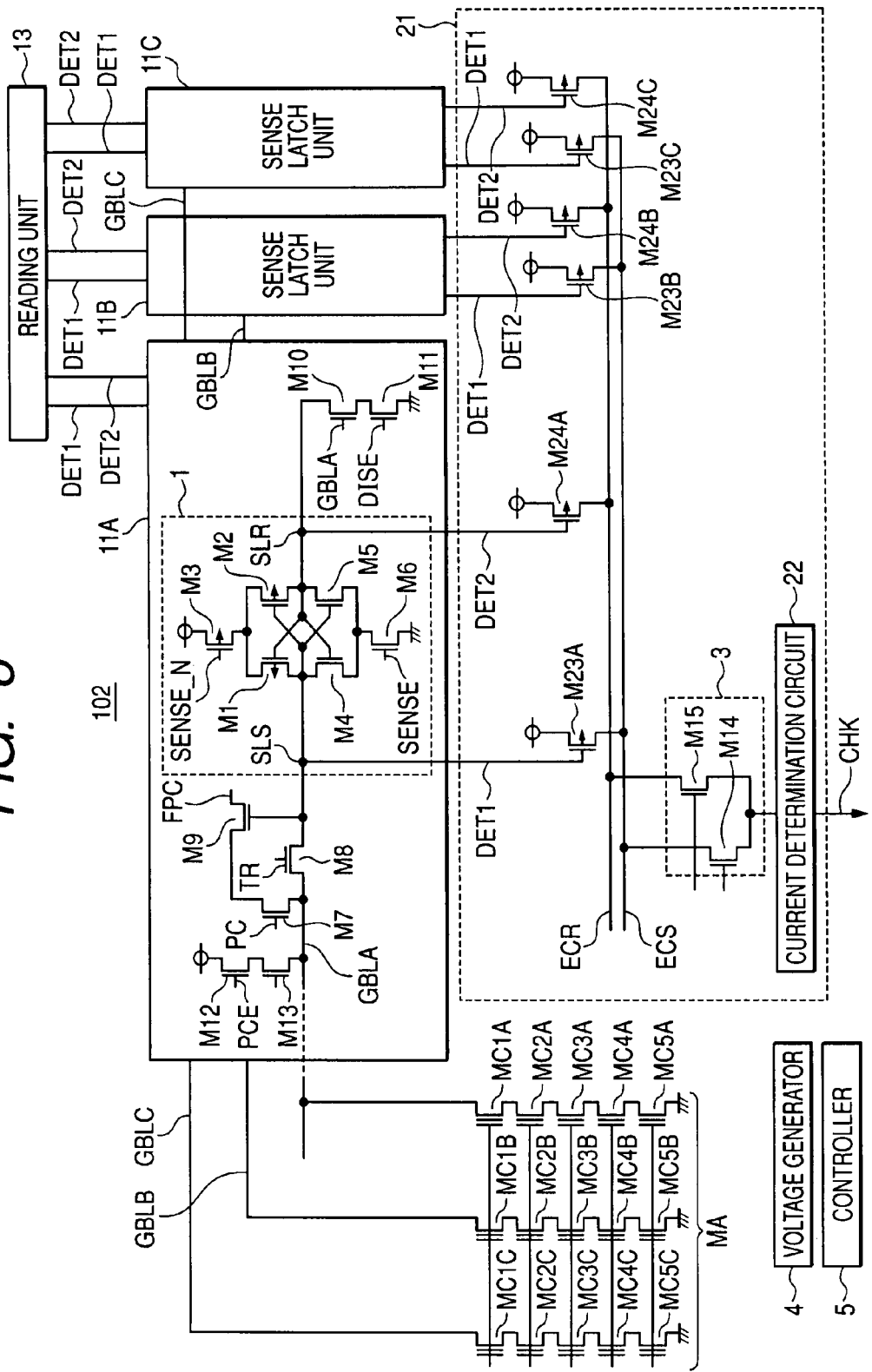
FIG. 6 is a diagram showing a configuration of a semiconductor device according to a second embodiment of the present invention.

FIG. 6 is a diagram showing a configuration of the semiconductor device according to the second embodiment of the present invention. Referring to FIG. 6, the semiconductor device 102 is provided with a determination unit 21 in place of the determination unit 12, different from the semiconductor device 101. The determination unit 21 includes P channel MOS transistors (first transistors) M23A through M23C, P channel MOS transistors (second transistors) M24A through M24C, a current determination circuit 22 and a switching circuit 3.

Figure 7:
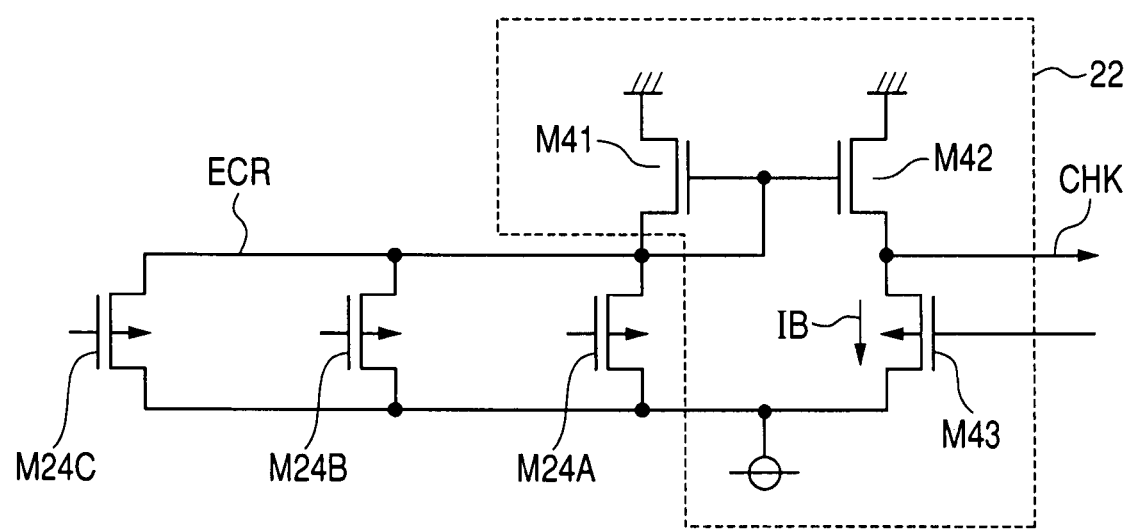
FIG. 7 is a diagram illustrating configurations of a current determination circuit and its peripheral circuits in the semiconductor device according to the second embodiment of the present invention.

FIG. 7 is a diagram showing configurations of the current determination circuit and its peripheral circuits in the semiconductor device according to the second embodiment of the present invention. A configuration wherein the P channel MOS transistors M24A through M24C and the current determination circuit 22 are directly coupled to one another, is shown in FIG. 7 for the purpose of providing an easy explanation.

Since a relationship between a current line ECS and the P channel MOS transistors M23A through M23C, and the current determination circuit 22 is similar to that between a current line ECR and the P channel MOS transistors M24A through M24C, and the current determination circuit 22, its detailed descriptions are omitted.

Referring to FIG. 7, the current determination circuit 22 includes N channel MOS transistors M41 and M42 and a P channel MOS transistor M43.

The gate and source of the N channel MOS transistor M41, the gate of the N channel MOS transistor M42, and the sources of the P channel MOS transistors M24A through M24C are coupled to one another.

The gate of the P channel MOS transistor M43 is supplied with a voltage of an L level and held in an on state.

When the sum of output currents of the P channel MOS transistors M24A through M24C is smaller than a reference current IB, the N channel MOS transistor M42 is brought to an off state, so that a determination or decision signal CHK becomes an L level. On the other hand, when the sum of the output currents of the P channel MOS transistors M24A through M24C is larger than the reference current IB, the N channel MOS transistor M42 is brought to an on state, so that the determination signal CHK becomes an H level.

Since the present semiconductor device is similar to the semiconductor device according to the first embodiment in other configuration and operation, their detailed explanations are omitted.

Thus, the semiconductor device according to the second embodiment of the present invention is capable of preventing complication of its circuit configuration and determining, in a short period time, whether the threshold voltage of each memory cell is normal.

A further embodiment of the present invention will next be explained using the drawings. Incidentally, the same symbols are attached to the same or corresponding portions in the drawings, of which the descriptions are omitted.

Third Preferred Embodiment

The present embodiment relates to a semiconductor device wherein the configuration of a determination unit is changed as compared with the semiconductor device according to the first embodiment. The present semiconductor device is similar to the semiconductor device according to the first embodiment except for the contents to be described below.

Figure 8:
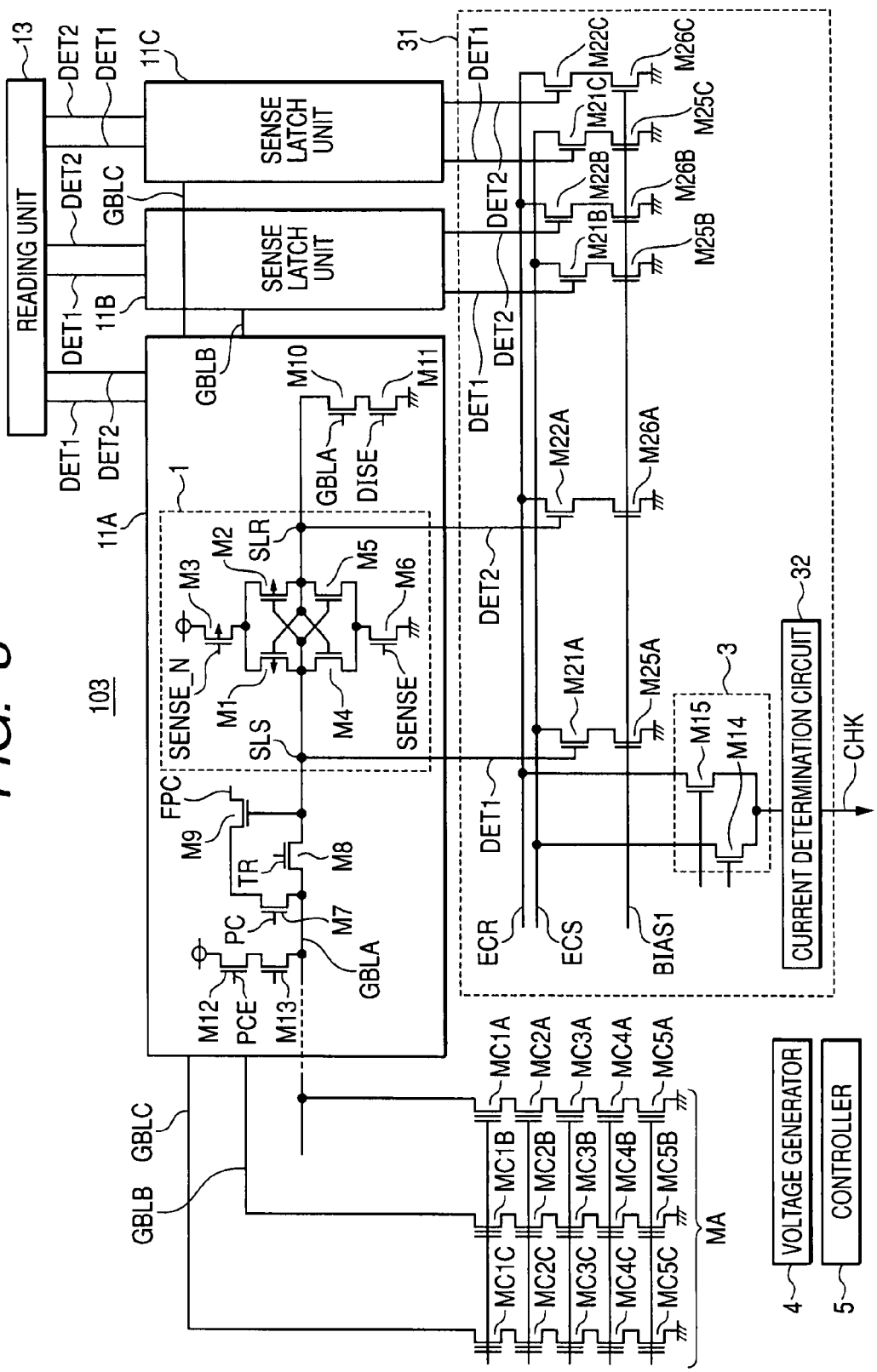
FIG. 8 is a diagram showing a configuration of a semiconductor device according to a third embodiment of the present invention.

FIG. 8 is a diagram showing a configuration of the semiconductor device according to the third embodiment of the present invention. Referring to FIG. 8, the semiconductor device 103 is equipped with a determination unit 31 in place of the determination unit 12 as compared with the semiconductor device 101. The determination unit 31 includes N channel MOS transistors (first transistors) M21A through M21C, N channel MOS transistors (second transistors) M22A through M22C, N channel MOS transistors (third transistors) M25A through M25C, N channel MOS transistors (fourth transistors) M26A through M26C, a current determination circuit 32, and a switching circuit 3.

The N channel MOS transistors M25A through M25C are coupled to their corresponding outputs or sources of the N channel MOS transistors M21A through M21C. The N channel MOS transistors M26A through M26C are coupled to their corresponding outputs or sources of the N channel MOS transistors M22A through M22C.

The N channel MOS transistors M25A through M25C restrict output currents of the N channel MOS transistors M21A through M21C to a predetermined value respectively. The N channel MOS transistors M26A through M26C restrict output currents of the N channel MOS transistors M22A through M22C to a predetermined value respectively.

That is, a bias voltage BIAS1 supplied to the gates of the N channel MOS transistors M25A through M25C and M26A through M26C is adjusted in such a manner that the output currents of the N channel MOS transistors M25A through M25C and M26A through M26C become smaller than the output currents of the N channel MOS transistors M21A through M21C and M22A through M22C.

With such a configuration, the values of currents that flow from an N channel MOS transistor M31 to the N channel MOS transistors M21A through M21C and M22A through M22C respectively held on become equal to one another. A decision as to whether each threshold voltage distribution is normal by comparison with a reference voltage IB can be performed accurately. That is, it is possible to determine accurately how many threshold voltages of memory cells are normal or abnormal.

Figure 9:
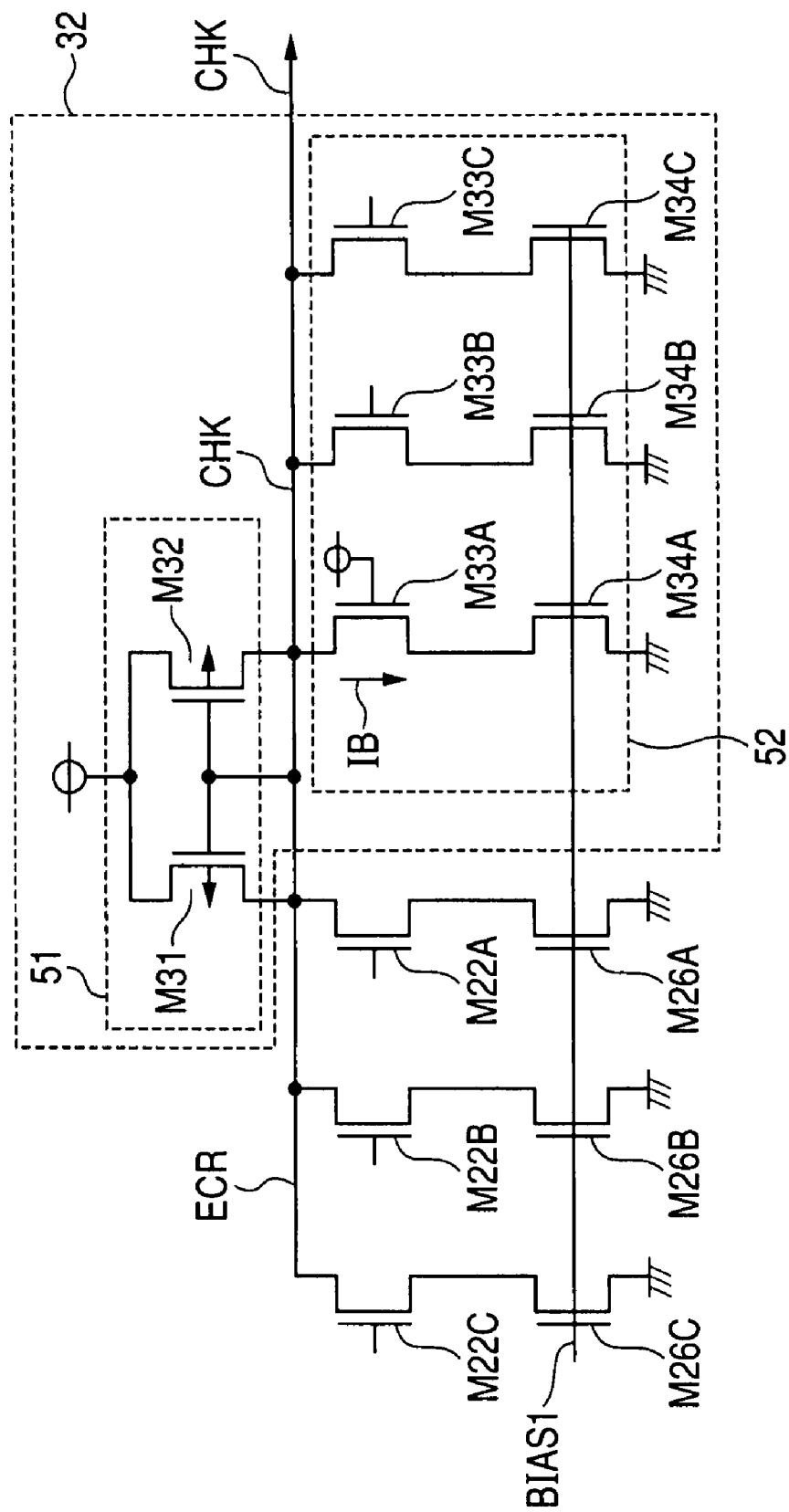
FIG. 9 is a diagram depicting configurations of a current determination circuit and its peripheral circuits in the semiconductor device according to the third embodiment of the present invention.

FIG. 9 is a diagram showing configurations of the current determination circuit and its peripheral circuits in the semiconductor device according to the third embodiment of the present invention. A configuration wherein the N channel MOS transistors M22A through M22C and the current determination circuit 32 are directly coupled to one another is shown in FIG. 9 in order to provide an easy explanation.

Since a relationship between a current line ECS and the N channel MOS transistors M21A through M21C, and the current determination circuit 32 is similar to that between a current line ECR and the N channel MOS transistors M22A through M22C, and the current determination circuit 32, its detailed descriptions are omitted.

Referring to FIG. 9, the current determination circuit 32 includes a comparator or comparison circuit 51 and a reference current generating circuit 52. The comparator 51 includes P channel MOS transistors M31 and M32. The reference current generating circuit 52 includes N channel MOS transistors (fifth transistors) M33A through M33C, and N channel MOS transistors (sixth transistors) M34A through M34C.

The comparator 51 compares the output currents of the N channel MOS transistors M22A through M22C and the reference current IB and outputs a determination signal CHK indicative of whether the threshold voltage of each verify-targeted memory cell is normal, based on the result of comparison.

The reference current generating circuit 52 supplies the reference current IB to the comparator 51. The N channel MOS transistors M33A through M33C are coupled in parallel and output the reference current IB to the comparator 51. The N channel MOS transistors M34A through M34C are coupled to their corresponding outputs or sources of the N channel MOS transistors M33A through M33C. The N channel MOS transistors M34A through M34C respectively restrict the output currents of the N channel MOS transistors M33A through M33C to a predetermined value, based on the bias voltage BIAS1 supplied to their gates. That is, the bias voltage BIAS1 is adjusted in such a manner that the output currents of the N channel MOS transistors M34A through M34C become smaller than those of the N channel MOS transistors M33A through M33C.

Of the N channel MOS transistors M34A through M34C, for example, the N channel MOS transistor M34A is smaller than the N channel MOS transistors M34B and M34C in size. For example, a gate width of the N channel MOS transistor M34A is equal to ½ of that of each of the N channel MOS transistors M34B and M34C. The sizes of the N channel MOS transistors M34B and M34C are identical to those of the N channel MOS transistors M26A through M26C. The sizes of the N channel MOS transistors M33A through M33C are identical to those of the N channel MOS transistors M22A through M22C.

The bias voltage BIAS1 is supplied to the gates (control electrodes) of the N channel MOS transistors M34A through M34C and the gates of the N channel MOS transistors M26A through M26C.

The reference current IB results in the sum of the output currents of the N channel MOS transistors M33A through M33C.

The N channel MOS transistor M33A is always in an on state because its gate is supplied with a voltage of an H level. Changing the voltages supplied to the gates of the N channel MOS transistors M33B and M33C makes it possible to change the number of decisions as to how many threshold voltages of memory cells in a plurality of verify-targeted memory cells are abnormal.

Assume now that the output currents of the N channel MOS transistors M22A through M22C and the output currents of the N channel MOS transistors M33B and M33C are restricted to IBIAS by the N channel MOS transistors M26A through M26C and the N channel MOS transistors M34B and M34C. Also assume that the gate width of the N channel MOS transistor M34A is equal to ½ of that of each of the N channel MOS transistors M34B and M34C, and thereby the output current of the N channel MOS transistor M33A is restricted to ½ of IBIAS.

When it is determined whether the number of memory cells abnormal in threshold voltage is less than or equal to one or greater than or equal to two, for example, the gate of the N channel MOS transistor M33B is supplied with an H-level voltage and the gate of the N channel MOS transistor M33C is supplied with an L-level voltage, for example. In this case, the reference current IB results in 1.5×IBIAS. In doing so, when the number of the memory cells abnormal in threshold voltage is less than or equal to one, the output currents of the N channel MOS transistors M22A through M22C accepted via the current line ECR result in less than or equal to 1.0× IBIAS, and the determination signal CHK is brought to an L level. On the other hand, when the number of the memory cells abnormal in threshold voltage is greater than or equal to two, the output currents of the N channel MOS transistors M22A through M22C received via the current line ECR results in greater than or equal to 2.0×IBIAS, and the determination signal CHK is brought to an H level.

With such a configuration, it is possible to prevent a decision as to whether each threshold voltage distribution is normal, from being made incorrectly due to variations in the production of the N channel MOS transistors M21A through M21C and M22A through M22C, and the N channel MOS transistors M33A through M33C.

A still further embodiment of the present invention will next be explained using the drawings. Incidentally, the same symbols are attached to the same or corresponding portions in the drawings, of which the descriptions are omitted.

Fourth Preferred Embodiment

The present embodiment relates to a semiconductor device wherein the configuration of a determination unit is changed as compared with the semiconductor device according to the third embodiment. The present semiconductor device is similar to the semiconductor device according to the third embodiment except for the contents to be described below.

Figure 10:
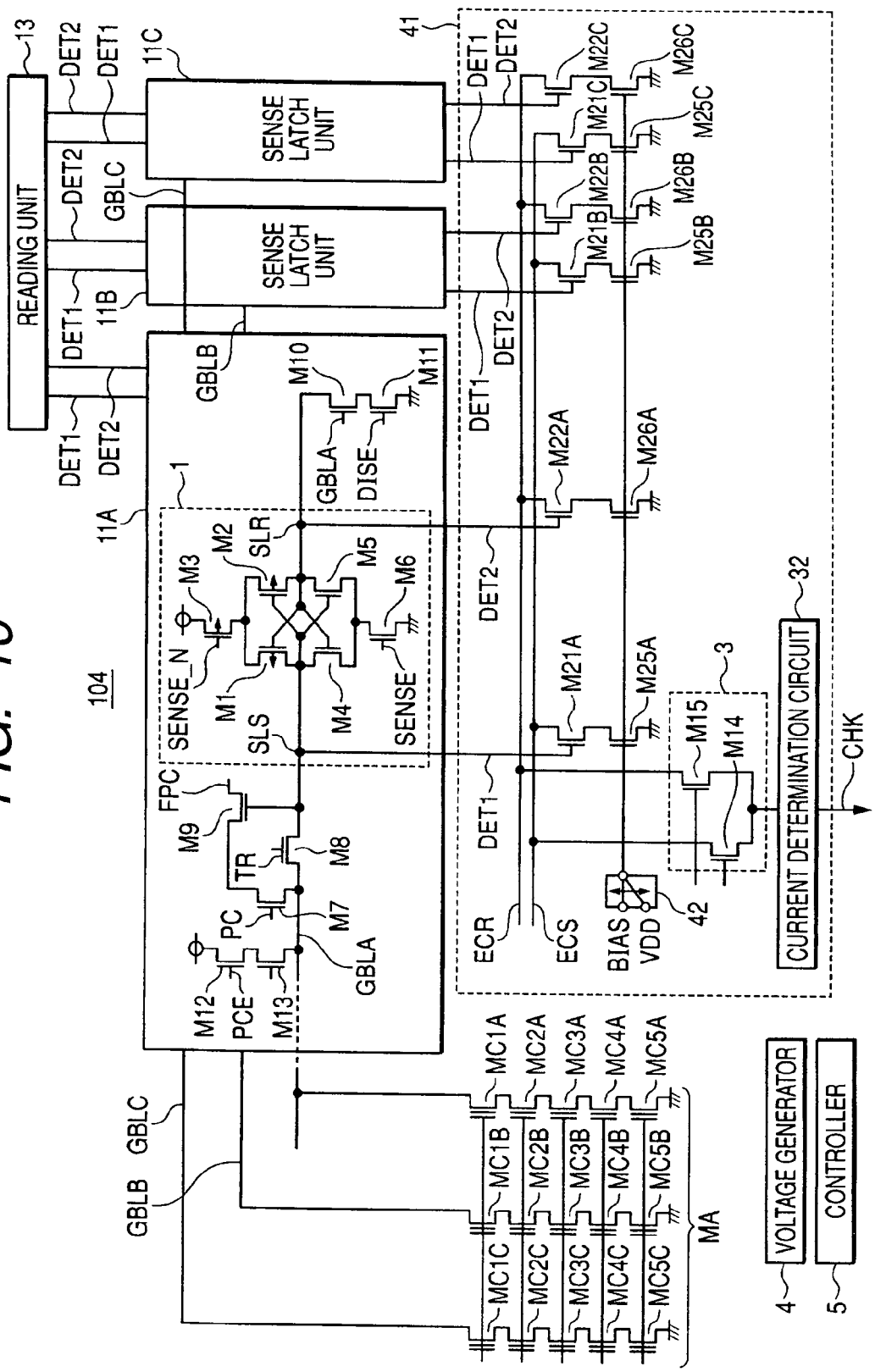
FIG. 10 is a diagram showing a configuration of a semiconductor device according to a fourth embodiment of the present invention.

FIG. 10 is a diagram showing a configuration of the semiconductor device according to the fourth embodiment of the present invention. Referring to FIG. 10, the semiconductor device 104 is equipped with a determination unit 41 in place of the determination unit 13 as compared with the semiconductor device 103. The determination unit 41 includes N channel MOS transistors (first transistors) M21A through M21C, N channel MOS transistors (second transistors) M22A through M22C, a current determination circuit 32, a switching circuit 3, and a voltage switching circuit 42.

The voltage switching circuit 42 switches the output of a bias voltage (control voltage) BIAS to the gates of the N channel MOS transistors M25A through M25C and M26A through M26C or the output of a source voltage (control voltage) VDD thereto.

Here, current lines ECR and ECS are generally large in capacitance value and resistance value because they are long routed over a memory mat with a memory cell array MA disposed thereon. Thus, it takes time until the levels of the current lines ECR and ECS are made stable, thereby increasing a verify time. When it is determined whether the threshold voltages of all verify-targeted memory cells are normal, it may be determined whether a plurality of N channel MOS transistors which are coupled to the current line ECR or ECS and output currents to the current determination circuit 32, are all in an off state. Therefore, a comparison between each current received via the current line ECR or ECS and a reference current IB needs not to have high accuracy. On the other hand, when it is determined whether the number of memory cells abnormal in threshold voltage, of plural verify-targeted memory cells is less than or equal to a predetermined value (where it is greater than or equal to 2), a comparison between each current received via the current line ECR or ECS and the reference current IB needs to have high accuracy.

To this end, the semiconductor device according to the fourth embodiment of the present invention is provided with the voltage switching circuit 42. Thus, when no verify requires high accuracy, the source voltage VDD is outputted to the gates of the N channel MOS transistors M25A through M25C and M26 through M26C to remove or withdraw restrictions on the output currents of the N channel MOS transistors M21A through M21C and M22A through M22C. With such a configuration, a large current is caused to flow through each of the current lines ECR and ECS to stabilize its level early, and the verify time can be shortened.

When the shortening of the verity time is not required, the bias voltage BIAS is outputted to the N channel MOS transistors M25A through M25C and M26A through M26C to restrict the output currents of the N channel MOS transistors M21A through M21C and M22A through M22C to a common predetermined value, thereby making it possible to enhance the accuracy of verify.

It should be considered that the embodiments disclosed this time are for the purpose of illustration in all respects and by no means limitative of the invention. The scope of the present invention is meant to be defined by claims other than the above descriptions and contain all changes within claims and the meaning and scope of equality.

What is claimed is:

1. The semiconductor device comprising:
a plurality of memory cells which store data based on threshold voltages thereof;
a plurality of bit lines on which read signals based on the stored data of the memory cells appear, respectively;
a plurality of sense amplifiers which are respectively disposed corresponding to the bit lines, and which respectively detect the read signals having appeared on the bit lines and output first and second signals respectively having logical levels different from one another from first and second nodes bases on the detected read signals; and
a determination unit which determines, based on the first and second signals respectively accepted from the first and second nodes of the sense amplifiers, whether the threshold voltages of the memory cells are normal,
wherein the determination unit includes:
a plurality of first transistors which are respectively disposed corresponding to the, sense amplifiers and which respectively change the states to on or off, based on the first signals received from the first nodes of the sense amplifiers;
a plurality of second transistors which are respectively disposed corresponding to the sense amplifiers and which respectively change the state to on or off, based on the second signals received from the second nodes of the sense amplifiers; and
a current determination circuit which detects output currents of the first transistors and output currents of the second transistors, and outputs signals indicative of whether the threshold values of the memory cells are normal, based on said results of detection.

2. The semiconductor device according to claim 1, wherein the determination unit further includes:
a plurality of third transistors which are electrically coupled to corresponding outputs of the first transistors and respectively restrict the output currents of the first transistors to a predetermined value; and
a plurality of fourth transistors which are electrically coupled to corresponding outputs of the second transistors and respectively restrict the output currents of the second transistors to a predetermined value.

3. The semiconductor device according to claim 2,
wherein the determination unit further includes a voltage switching circuit which switches the output of a first control voltage to the third transistors and the fourth transistors or the output of a second control voltage thereto,
wherein the third transistors respectively switch, based on a control voltage received from the voltage switching circuit, whether the output currents of the first transistors are restricted to a predetermined value, and
wherein the fourth transistors respectively switch, based on the control voltage received from the voltage switching circuit, whether the output currents of the second transistors are restricted to a predetermined value.

4. The semiconductor device according to claim 1,
wherein the determination unit further includes a plurality of third transistors which are electrically coupled to corresponding outputs of the first transistors and respectively restrict the output currents of the first transistors to a predetermined value,
wherein the current determination circuit includes a comparator which compares the output currents of the first transistors with a reference current and outputs a signal indicative of whether the threshold voltages of the memory cells are normal, based on the results of comparison, and a reference current generating circuit which supplies the reference current to the comparator,
wherein the reference current generating circuit includes a plurality of fifth transistors which are coupled in parallel and respectively output a reference current to the comparator, and a plurality of sixth transistors which are electrically coupled to corresponding outputs of the fifth transistors and respectively restrict the output currents of the fifth transistors to a predetermined value,
wherein control electrodes of the sixth transistors and control electrodes of the third transistors are respectively supplied with a predetermined voltage, and
wherein one sixth transistor of the sixth transistors is smaller than the other sixth transistors in size, and the remaining sixth transistors and the third transistors are identical to one another in size.

* * * * *